United States Patent
Panciatici et al.

(10) Patent No.: US 10,832,095 B2
(45) Date of Patent: Nov. 10, 2020

(54) CLASSIFICATION OF 2D IMAGES ACCORDING TO TYPES OF 3D ARRANGEMENT

(71) Applicant: DASSAULT SYSTEMES, Velizy Villacoublay (FR)

(72) Inventors: Jeannine Panciatici, Aix-en-Provence (FR); Kingdom Torsu, Aix-en-Provence (FR); Mariem Soltani, Aix-en-Provence (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 121 days.

(21) Appl. No.: 16/164,651

(22) Filed: Oct. 18, 2018

(65) Prior Publication Data

US 2019/0114514 A1 Apr. 18, 2019

(30) Foreign Application Priority Data

Oct. 18, 2017 (EP) ..................................... 17306408

(51) Int. Cl.
*G06K 9/62* (2006.01)
*G06T 17/00* (2006.01)
(Continued)

(52) U.S. Cl.
CPC ....... *G06K 9/6267* (2013.01); *G06K 9/00624* (2013.01); *G06K 9/6255* (2013.01);
(Continued)

(58) Field of Classification Search
CPC . G06T 17/20; G06T 2200/04; G06T 2200/28; G06T 17/00; G06T 7/55;
(Continued)

(56) References Cited

U.S. PATENT DOCUMENTS 6,717,577 B1* 4/2004 Cheng ................. G06F 12/0875
345/419
7,142,726 B2* 11/2006 Ziegler ................... G06T 17/10
382/285
(Continued)

OTHER PUBLICATIONS

Ankur Handa, et al.; "SceneNet: An Annotated Model Generator for Indoor Scene Understanding"; 2016 IEEE International Conference on Robotics and Automation (ICRA); Stockholm, Sweeden; May 16-21, 2016; 7 pages.
(Continued)

*Primary Examiner* — Aklilu K Woldemariam
(74) *Attorney, Agent, or Firm* — Oblon, McClelland, Maier & Neustadt, L.L.P.

(57) ABSTRACT

The disclosure notably relates to a computer-implemented method for forming a dataset configured for learning a function. The function is configured to classify 2D images according to predetermined types of 3D arrangement with respect to objects visible in the 2D images. The method comprising for each respective type of 3D arrangement, constructing 3D scenes each comprising 3D modeled objects arranged according to the respective type of 3D arrangement, generating 2D images each representing a respective 2D perspective of a respective constructed 3D scene where visible 3D modeled objects are among the 3D modeled objects of the respective constructed 3D scene which are arranged according to the respective type of 3D arrangement, and adding to the dataset training patterns each including a respective generated 2D image and information indicative of the respective type of 3D arrangement. Such a method improves 2D image classification.

20 Claims, 8 Drawing Sheets

(51) Int. Cl.
  *G06N 20/00* (2019.01)
  *G06K 9/00* (2006.01)
  *G06F 30/00* (2020.01)
(52) U.S. Cl.
  CPC ............ *G06K 9/6256* (2013.01); *G06N 20/00* (2019.01); *G06T 17/00* (2013.01); *G06F 30/00* (2020.01)
(58) Field of Classification Search
  CPC ........... G06T 7/70; G06T 17/05; G06T 19/20; G06T 17/10; G06T 2219/2004; G06T 7/00; G06T 19/00; G06T 2200/08; G06K 9/00624; G06K 9/00664; G06K 9/6256; G06K 2209/40; G06K 9/6255; G06K 9/6267; H04N 13/271; H04N 5/23238; H04N 13/25; G01B 11/24; G06F 3/04815; G06F 3/011; G02B 2027/014
  USPC ........ 345/557, 625, 418, 419, 420; 382/154, 382/224
  See application file for complete search history.

(56) References Cited

U.S. PATENT DOCUMENTS

| | | | | |
|---|---|---|---|---|
| 8,941,644 | B2* | 1/2015 | Zhu | G06T 17/00 345/419 |
| 2002/0015048 | A1* | 2/2002 | Nister | G06T 7/55 345/625 |
| 2004/0184655 | A1* | 9/2004 | Ziegler | G06T 17/10 382/154 |
| 2009/0021513 | A1* | 1/2009 | Joshi | G06T 15/005 345/419 |
| 2011/0273369 | A1* | 11/2011 | Imai | G06T 15/20 345/158 |
| 2012/0146991 | A1* | 6/2012 | Bala | G06T 15/04 345/419 |
| 2013/0135304 | A1* | 5/2013 | Chen | G06T 17/00 345/420 |
| 2013/0156297 | A1* | 6/2013 | Shotton | G06K 9/6255 382/159 |
| 2015/0269785 | A1* | 9/2015 | Bell | G06T 15/20 345/427 |
| 2017/0193693 | A1* | 7/2017 | Robert | G06K 9/00664 |
| 2018/0144535 | A1* | 5/2018 | Ford | G06T 17/20 |

OTHER PUBLICATIONS

Angel Chang, et al.; "Matterport3D: Learning from RGB-D Data in Indoor Environments"; ARXIV:1709.06158V1 [CS.CV]; Sep. 18, 2017; 25 pages.
Julian Straub, et al."A Mixture of Manhattan Frames: Beyond the Manhattan Word"; 2014 IEEE Conference on Computer Vision and Pattern Recognition; 8 pages.
Erick Delage, et al.; "Automatic Single-Image 3d Reconstructions of Indoor Manhattan World Scenes"; Stanford University, Stanford, CA 94305; {edelage,hllee,ang}@cs.stanford.edu; 17 pages.
Matthew Fisher, et al.; "Example-based Synthesis of 3D Object Arrangements"; 11 pages.
Yu Xiang, et al.; "ObjectNet3D: A Large Scale Database for 3D Object Recognition"; Stanford University, Standford, USA; B. Leibe et al. (EDS): ECCV 2016, Part VIII, LNCS 9912, 2016; 17 pages.
Extended Search Report dated Apr. 24, 2018, in European Patent Application No. 17306408.0-1207; 10 pages.
Pascal Vincent, et al.; "Extracting and Composing Robust Features with Denoising Autoencoders"; Proceedings of the 25th International Conference on Machine Learning, Helsinki, Finland, 2008; 8 pages.
David Kriesel; "A Brief Introduction to Neural Networks"; http://www.dkriesel.com/en/science/neural_networks; 244 pages.
Qixing Huang, et al.; "Joint Shape Segmentation with Linear Programming"; Stanford University; 11 pages.
Yoshua Bengio, et al.; "Generalized Denoising Auto-Encoders as Generative Models"; Departement D'Informatique Et Recherche Operationnelle; University of Montreal; 9 pages.
Lu Wang, et al.; "Supporting Range and Segment-Based Hysteresis Thresholding in Edge Detection"; University of Southern California; 4 pages.
Yoshua Bengio, "Learning Deep Architectures for AI"; Dept. IRO, Universite De Montreal; http://www/iro.umontreal.ca/-bengioy; Technical Report 1312; 56 pages.
Vladimir G. Kim, et al.; "Learning Part-based Templates from Large Collections of 3D Shapes", 12 pages.
Ian J. Goodfellow, et al.; "Generative Adversarial Nets"; ARXIV:1406.2661V1 [STAT.ML]; Jun. 10, 2014; 9 pages.
Patrick H. Denis; Efficient Edge-based Methods for Estimating Manhattan Frames in Urban Imagery: 88 pages.
Yoshua Bengio, et al.; "Greedy Layer-Wise Training of Deep Networks"; 8 pages.
James M. Coughlan, et al.; "Manhattan World: Compass Direction from a Single Image by Bayesian Inference"; Smith-Kettlewell Eye Research Institute; San Francisco, CA 94115; 7 pages.
Melinos Averkiou, et al.; "Autocorrelation Descript for Efficient Co-alignment for 3D Shape Collections"; Computer Graphics Forum; vol. 34 (2015); No. 2; 11 pages.
Devrim Akca,; "Co-registration of Surfaces by 3D Least Squares Matching", Photogrammetric Engineering & Remote Sensing; vol. 76, No. 3; Mar. 2010; 12 pages.
Yunhai Wang, et al.; "Active Co-Analysis of a Set of Shapes"; ACM Transactions on Graphics; vol. 31, No. 6, Article 165; Nov. 2012; 10 pages.
Diederik P. Kingma, et al.; "Auto-Encoding Variational Bayes", ARXIV:1312.6114V10 [STAT.ML]; May 1, 2014; 14 pages.
Mohamed Chaouch, at al.; "Alignment of 3D Models"; Preprint Submitted to Graphical Models; Nov. 12, 2008; https://hal.inria.fr/hal-00804653; 28 pages.
Diederik P. Kingma, et al.; "Adam: A Method for Stochastic Optimization"; Published as a Conference Paper at ICLR 2015; ARXIV:1412.6980V9 [CS.LG]; Jan. 30, 2017; 15 pages.
Esma Elghoul, et al.; "A Segmentation Transfer Approach for Rigid Models"; Journal of Information Science and Engineering, Academia Sinica, 2015; 16 pages.
Aleksey Golovinsky, et al."Consistent Segmentation of 3D Models"; Preprint Submitted to Computers and Graphics; Feb. 25; 2009; 9 pages.
Geoffrey E. Hinton, et al.; "A Fast Learning Algorithm for Deep Belief Nets"; To Appear in Neural Computation 2006; 16 pages.

* cited by examiner $\varphi(1) = t_1 \quad \varphi(2) = t_2 \quad \varphi(3) = t_3$ $p(5) = w_1 t_1 + w_2 t_2 + w_3 t_3$
$\varphi(5) = \dfrac{1}{1 + e^{-p(5)}}$

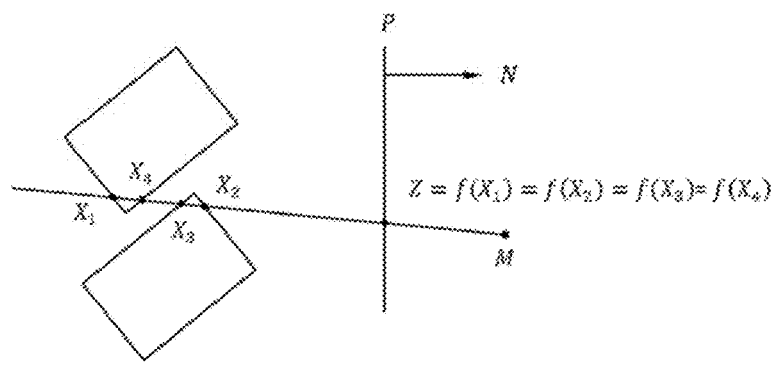
FIG. 7
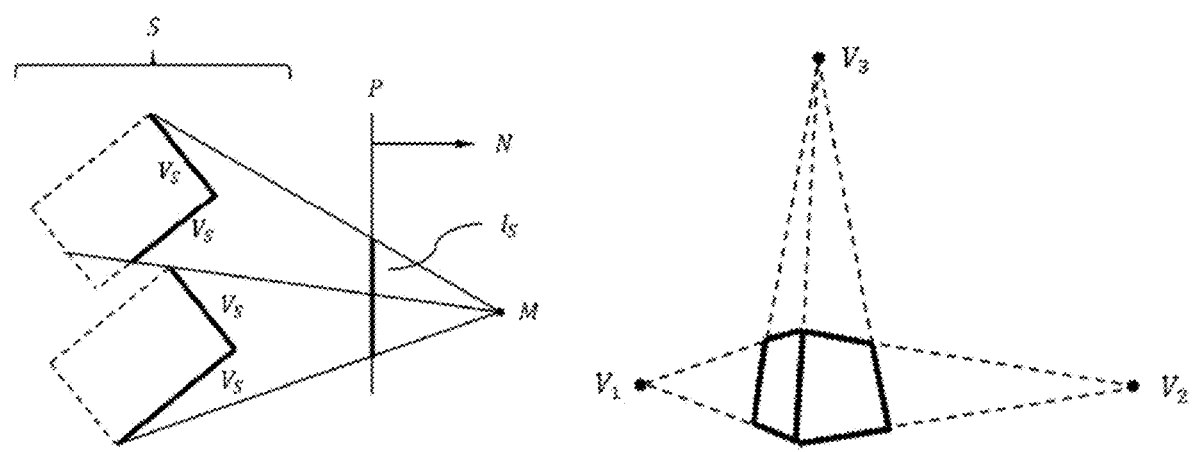
FIG. 8
FIG. 9
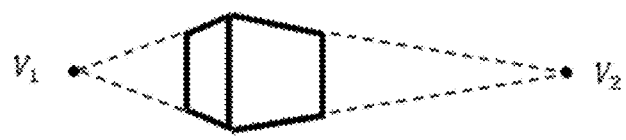
FIG. 10

CLASSIFICATION OF 2D IMAGES ACCORDING TO TYPES OF 3D ARRANGEMENT

CROSS-REFERENCE TO RELATED APPLICATIONS

This application claims priority under 35 U.S.C. § 119 or 365 to European Application No. 17306408.0, filed Oct. 18, 2017. The entire contents of the above application(s) are incorporated herein by reference.

FIELD OF THE INVENTION

The invention relates to the field of computer programs and systems, and more specifically to forming a dataset configured for learning a function adapted to classify two-dimensional (2D) images according to predetermined types of three-dimensional (3D) arrangement.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

In this context and other contexts, it may be useful to classify a 2D image so as to recognize a type of 3D arrangement of objects visible in the 2D image: for example Manhattan type, Atlanta type or neither Manhattan nor Atlanta type.

SUMMARY OF THE INVENTION

It is therefore provided a computer-implemented method for forming a dataset configured for learning a function. The function is configured to classify 2D images according to predetermined types of 3D arrangement with respect to objects visible in the 2D images. The method is looped for each respective type of 3D arrangement. The method comprises constructing 3D scenes. Each constructed 3D scene comprises 3D modeled objects arranged according to the respective type of 3D arrangement. The method also comprises generating 2D images. Each generated 2D image represents a respective 2D perspective of a respective constructed 3D scene. In the respective 2D perspective, visible 3D modeled objects are among the 3D modeled objects of the respective constructed 3D scene which are arranged according to the respective type of 3D arrangement. The method also comprises adding to the dataset training patterns. Each added training pattern includes a respective generated 2D image and information indicative of the respective type of 3D arrangement.

The method thereby constitutes an application of the machine learning paradigm to the classification of 2D images according to types of 3D arrangement of objects visible in the 2D images. The method indeed proposes to form a dataset adapted for learning a function configured to perform such classification. The method thus provides relatively efficiently an accurate function whose application is moreover fast enough for real-time use. Furthermore, the method proposes to form the dataset via 3D modeling. In particular, the method comprises constructing 3D scenes and then generating training patterns based on the 3D scenes to populate the dataset. Thanks to such workflow, the method relatively efficiently forms a relatively diverse dataset. The workflow indeed enables the method to output as many training patterns as necessary and totally under control. This allows a machine learning which is efficient and safe.

The method may comprise one or more of the following:
- for at least one respective type of 3D arrangement, all 3D modeled objects of one or more constructed 3D scenes are arranged according to the respective type of 3D arrangement;
- the predetermined types of 3D arrangement comprise the Manhattan type and/or the Atlanta type;
- the constructing of each respective 3D scene for a respective type of 3D arrangement comprises providing an initial 3D scene and one or more reference frames, and arranging 3D modeled objects in the initial 3D scene relative to the one or more reference frames based on the respective type of 3D arrangement;
- the predetermined types of 3D arrangement comprise the Manhattan type and for constructing a respective 3D scene for the Manhattan type, the provided one or more reference frames consist of a single Manhattan frame and/or the provided initial 3D scene comprises 3D modeled objects each aligned with the single Manhattan frame;
- the predetermined types of 3D arrangement comprise the Atlanta type and for constructing a respective 3D scene for the Atlanta type, the provided one or more reference frames consist of one or more Manhattan frames sharing an axis and/or the provided initial 3D scene comprises 3D modeled objects each aligned with a respective Manhattan frame, optionally with a same Manhattan frame;
- for constructing a respective 3D scene for the Manhattan type, adding 3D modeled objects to the initial 3D scene each aligned with the single Manhattan frame;
- for constructing a respective 3D scene for the Atlanta type, adding 3D modeled objects to the initial 3D scene each aligned with a respective Manhattan frame;
- providing an initial 3D scene comprises providing an initial 2D image representing the initial 3D scene, and determining the initial 3D scene based on the initial 2D image;
- the determining of the initial 3D scene based on the initial 2D image comprises computing characteristic line segments of the initial 2D image, determining vanishing points based on the characteristic line segments, determining one or more Manhattan frames and a respective projection from 2D to 3D, based on respective vanishing points, and constructing 3D modeled objects in at least one respective Manhattan frame based on respective characteristic line segments and on the respective projection;

the computing of the characteristic line segments of the initial 2D image comprises computing edge pixels, and fitting edge pixels with maximal lines;

the method further comprises learning a function based on the dataset, and optionally further comprising providing an input 2D image and applying the learnt function to the input 2D image, thereby classifying the input 2D image;

the method further comprises determining one or more projections each from 2D to a respective 3D Manhattan frame, based on the input 2D image and on the classification of the input 2D image; and/or the method further comprises outputting a 3D scene represented by the input 2D image based on the one or more projections, and optionally further comprising editing the 3D scene by user-sketching on a representation of the input 2D image.

It is further provided a dataset formable by the method. Such a dataset comprises the training patterns added by the method, the dataset being thereby relatively exhaustive and accurate.

It is further provided a process comprising learning the function with the dataset. It is further provided a function learnable by such a process. The function is—e.g. a neural network—configured to classify 2D images according to the predetermined types of 3D arrangement.

It is further provided a computer program comprising instructions for performing the method and/or the process.

It is further provided a data structure comprising the dataset, the function and/or the program.

It is further provided a device comprising a data storage medium having recorded thereon the data structure. The device may form a non-transitory computer-readable medium. The device may alternatively comprise a processor coupled to the data storage medium. The device may thus form a system. The system may further comprise a graphical user interface coupled to the processor.

BRIEF DESCRIPTION OF THE DRAWINGS

Embodiments of the invention will now be described, by way of non-limiting example, and in reference to the accompanying drawings, where:

FIGS. 2, 3, 4, 5, 6, 7, 8, 9, 10, 11, 12, 13, 14, 15, 16, 17, 18, 19, 20, 21, 22, 23, 24, 25, 26 and 27 illustrate the method.

DETAILED DESCRIPTION OF THE INVENTION

Figure 1:
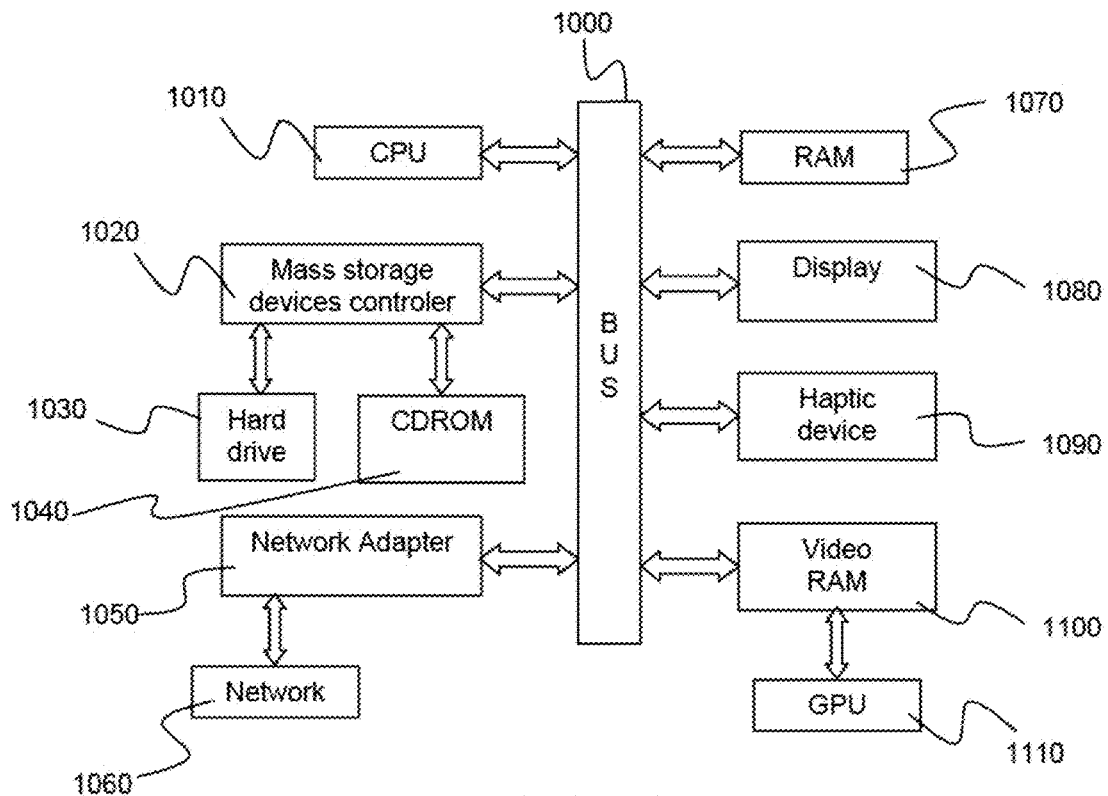
FIG. 1 shows an example of the system.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined. In examples, the construction of 3D scenes, the generation of 2D images, and the addition to the dataset may be performed fully automatically.

A typical example of computer-implementation of a method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database).

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

A modeled object is any object defined by data stored e.g. in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system.

In the context of CAD, a modeled object may typically be a 3D modeled object. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task).

A 3D modeled object may be designed with and/or loaded in a CAD system. By CAD system, it is meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Unes, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

A 3D scene designates any arrangement (i.e. disposition) of 3D modeled objects in a 3D space. The 3D space may comprise boundaries, for example corresponding to walls of a room. In case the 3D space comprises boundaries, one or more boundaries may in examples be covered with a texture. The construction of a 3D scene by the method may comprise providing an initial 3D scene comprising a 3D space (e.g. an empty 3D space or a 3D space already comprising 3D modeled objects) and then arranging 3D modeled objects in the initial 3D scene. The method may for example comprise providing one or more reference frames (i.e. basis) assigned to the 3D space and performing any arrangement based on the one or more reference frames. Arranging 3D modeled objects in the initial 3D scene may comprise adding, moving and/or editing new 3D modeled objects, and/or removing, moving and/or editing existing 3D modeled objects. The added 3D modeled objects may come from any source, for example retrieved from a database of 3D modeled objects and/or designed with a CAD system.

A 2D image contemplated by the method is a data structure that represents a 2D spatial distribution of a physical signal, such as a photograph. The physical signal may be any signal, for example color, level of gray, depth or presence of material or object boundary. Correspondingly, the image may be an RGB, a grayscale or a depth image, or yet a 2D contour model. The spatial distribution may be represented in any way, for example with a grid of values and thereby defining pixels, the grid being possibly irregular or regular. The images added to the dataset and/or to be inputted to the function may all be of a same type, for example all rectangular 2D RGB or grayscale images. Alternatively, the images added to the dataset and/or to be inputted to the function may comprise different types of images (e.g. even among first elements or among second elements of training patterns). The method may generate synthetic 2D images to form the dataset, such as synthetic photographs. The learnt function may then be applied on a synthetic 2D image (such as a synthetic photograph) and/or on a natural 2D image (such as a natural photograph).

At least a part (e.g. all) of the constructed scenes may be used by the method each to generate one or more (i.e. any number of) respective 2D images that each represent a respective 2D perspective of a constructed 3D scene. Each generated 2D image thereby forms a visual representation of a part of a constructed 3D scene consisting of visible 3D modeled objects (i.e. 3D modeled objects that are partly or fully captioned by the 2D image).

The generation of a 2D image may comprise providing specifications of the 2D perspective, and projection of the constructed 3D scene on a 2D structure according to the 2D perspective so as to form the 2D image. The specifications may comprise a surface (such as a plane) and an observer's position (such as a finite position) to perform the projection. The 2D perspective may in examples be a conical perspective.

The generation may optionally comprise any pre-processing of the constructed 3D scene before the projection, and/or any post-processing of the constructed 3D scene after the projection. The pre-processing may in examples comprise removing 3D modeled objects considered insignificant according to any predetermined criterion, and/or identifying visible versus hidden 3D modeled objects so as to project only visible objects. The post-processing may in examples comprise adding colors and/or textures (e.g. if not already present in 3D).

The constructed 3D scenes may represent real world scenes, in other words arrangements of real world objects. The 3D modeled objects of the constructed 3D scenes may each represent the geometry of a real-world object. The 3D modeled objects of the constructed 3D scenes may notably include 3D modeled objects representing products such as mechanical parts, furniture, and/or consumable goods, 3D modeled objects representing architectural objects such as building exteriors, building interiors, and/or urban constructions, and/or 3D modeled objects representing natural objects such as plants, animals, humans and/or landscapes. In examples, the constructed 3D scenes may represent architectural scenes.

The method deals with a predetermined set of 3D arrangement types.

A 3D arrangement type is a particular way or manner objects (e.g. 3D modeled objects of a 3D scene or real-world objects) are arranged one relative to the other in 3D. In other words, a 3D arrangement type defines how objects are positioned one with respect to the other in 3D.

When constructing a 3D scene comprising 3D modeled objects arranged according to a respective arrangement type, the method may comprise arranging 3D modeled objects in the 3D scene in a manner which respects the respective arrangement type. Thus, any construction step may be performed while making sure that said 3D modeled objects always respect the arrangement type.

Arrangement of 3D modeled objects may be defined via frames assigned each to a respective 3D modeled object. The relative arrangement of two or more 3D modeled objects may then be defined by how the frames associated each to a respective one of the two or more 3D modeled objects are arranged one relative to the other. A relative positioning between the frames may be considered. Alternatively, a positioning of the frames relative to one or more reference frames of the 3D scene may be considered. Arrangement of real-world objects may be defined via the definition of arrangement of 3D modeled objects representing the real-world objects.

The frames may be oriented or non-oriented. Each 3D modeled object may be assigned an (e.g. natural) orthogonal frame, i.e. defining three orthogonal directions and for example noted (x,y,z). For example, 3D modeled objects representing cars or chairs are assigned a natural frame, for example with the z-axis corresponding to the bottom-to-top direction, the x-axis corresponding to the left-to-right direction when sitting on or in the object, and the y-axis corresponding to the back-to-front direction when sitting on or in the object. The frame assigned to a 3D modeled object may correspond to edges of the 3D modeled object that are to yield characteristic lines in 2D images representing the 3D modeled object. The edges may be among those having a highest length, for example the three edges having the highest length. The edges may be sharp and/or straight (i.e. rectilinear). Alternatively or additionally, the frame assigned to a 3D modeled object may correspond to a set of three such edges orthonormal one relative to the other.

In examples, the predetermined set of 3D arrangement types may comprise or consist of a set of 3D alignment types, i.e. corresponding to different manners to align objects.

Two or more 3D modeled objects may be considered aligned, when their frames are all aligned. Otherwise the 3D modeled objects may be considered unaligned. Two or more 3D modeled objects may be unaligned but considered to share an axis, when their frames are not all aligned but share an axis.

Two frames may be considered aligned when each axis of a frame is parallel to an axis of the other frame. In the case the two frames are non-oriented, the condition may be sufficient. In the case where the two frames are oriented, the definition may optionally further comprise the condition that two such parallel axis also have the same orientation and/or correspond to the same axis index.

Two or more frames may be considered to share an axis when at least one axis of a frame is parallel to an axis of each of the other frame(s). In the case the two frames are non-oriented, the condition may be sufficient. In the case where the two frames are oriented, the definition may optionally further comprise the condition that two such parallel axis also have the same orientation and/or correspond to the same axis index.

It is thus noted that 3D modeled objects may be considered to be aligned to although they are not necessarily arranged on a line nor on a grid, the notion of alignment corresponding to how the three axis of frames associated to the 3D modeled objects relate to each other. It is also noted that a 3D modeled object may be aligned with a reference frame or share an axis with such reference frame, with a definition similar alignment with another 3D modeled object.

In examples, the predetermined types of 3D arrangement may comprise the Manhattan type and one or more other 3D arrangement types. In such examples, the one or more other types may for example comprise the Atlanta type. For example, the function may be configured to classify a 2D image in one of three 3D alignment types consisting of the Manhattan type, the Atlanta type, and the neither Manhattan nor Atlanta type (also referred to as the "other" type). Such categories of alignment are particularly interesting to recognize in 2D images.

The Manhattan type and the Atlanta type are well-known types of 3D alignment. 3D modeled objects are said to be arranged according to the Manhattan type when they are all aligned. 3D modeled objects are said to be arranged according to the Atlanta type when they are not all aligned but all share a common axis. Optionally, the Atlanta type may comprise the further condition that the 3D modeled objects may be partitioned in a finite number of subsets arranged according to the Manhattan type, and optionally with the further condition that the partitioning corresponds to a partitioning of the 3D scene into convex sub-scenes. The neither Manhattan nor Atlanta type designates any 3D alignment which does not respect either of the Manhattan type or the Atlanta type.

A 3D scene may be provided with one or more Manhattan frames and 3D modeled objects may be arranged in the 3D scene based on such one or more Manhattan frames. A Manhattan frame is merely a frame of a 3D scene which comprises 3D modeled objects arranged according to the Manhattan or Atlanta type. A plurality of 3D modeled objects all aligned with a same (e.g. single) Manhattan frame of a 3D scene are arranged according to the Manhattan type. A plurality of 3D modeled objects all aligned with a respective one of several Manhattan frames of a 3D scene which share a same axis are arranged according to the Atlanta type when at least two 3D modeled objects are aligned with different Manhattan frames. Based on an initial 3D scene comprising one or more reference frames, the method may thereby efficiently produce new arrangements of the Manhattan or Atlanta type each time by adding one or more new 3D modeled objects to the initial 3D scene aligned accordingly with respect to the reference frame(s), said reference frame(s) thereby turning into Manhattan frame(s).

The method is for forming (i.e. building or establishing) a dataset configured for learning a function. The method adds training patterns to the dataset. The dataset may be initialized and/or empty before the beginning of the method. The method populates the dataset with training patterns.

For each given one of the predetermined types of 3D arrangement, the method constructs 3D scenes where at least some 3D modeled objects are arranged according to the given type 3D arrangement. The method may then generate one or more 2D images where at least some of the visible 3D modeled objects are among those which are arranged according to the given type of 3D arrangement.

The at least some of the visible 3D modeled objects may consist of all the visible 3D modeled objects or most of them (e.g. above any predetermined quantification threshold, e.g. determined based on an average number of 3D modeled objects in the 3D scene), or alternatively all the most important visible 3D modeled objects (e.g. above any predetermined importance threshold, such as a size threshold, e.g. determined based on an average size of 3D modeled objects in the 3D scene) or most of them (e.g. above any predetermined quantification threshold, e.g. determined based on an average number of 3D modeled objects in the 3D scene).

By adding to the dataset being formed training patterns each including such a 2D image associated with any type of information indicative of the type of 3D arrangement from which it was generated (e.g. such as a label), the method populates the dataset with data allowing the later machine-leaning of a function which can recognize the type of 3D arrangement of objects represented by 2D images.

The function is configured to classify 2D images. In other words, the function takes, as an input, a 2D image (e.g. a 2D image representing a real-world scene representable by a 3D scene) and automatically provides, as an output, any information indicative of the 3D arrangement type that applies to the input 2D image. The output of the function may comprise or consist of a label indicative of a respective arrangement type. The output label may for example be indicative of the arrangement type most likely to be respected by objects visible in the input 2D image. Alternatively or additionally, the output of the function may comprise or consist of a probability distribution on all arrangement types. The output probability distribution may for example comprise values each associated to a given arrangement type and indicative of a probability that the given arrangement type be respected by objects visible in the input 2D image.

The construction of one or more (e.g. all) 3D scenes for one or more (e.g. all) respective types of 3D arrangement may be such that all 3D modeled are arranged each time according to the respective 3D arrangement type. This way, whichever the 2D perspective according to which a 2D image of the 3D scene is generated, all 3D modeled objects visible in the 2D image are necessarily arranged according to the respective type of 3D arrangement. This allows generating the 2D images according to any 2D perspectives, such as 2D perspectives at least a level of randomness.

In examples, the construction of one or more 3D scenes for one or more respective types of 3D arrangements may alternatively comprise 3D modeled objects which are not arranged according to the respective 3D arrangement type. In examples of such a case, the 2D images may be generated according to 2D perspectives for which none or almost none of such 3D modeled object are not visible (e.g. hidden by other 3D modeled objects which are arranged according to the respective 3D arrangement type). Such 2D perspectives may be determined in any way. In other examples of such a case, the 3D modeled objects which are not arranged may be of lesser importance. Thereby, such 3D modeled objects may be visible in generated 2D images with low consequences on robustness of the machine-learning.

The construction of 3D scenes for each respective 3D arrangement type may be performed by providing an initial 3D scene and by adding 3D modeled objects to the initial 3D scene in a way that the result respects the intended 3D arrangement type. A same initial 3D scene may be used for a plurality of scenes constructed for one or more 3D arrangement types.

Now, for constructing a respective 3D scene for the Manhattan type, the provided initial 3D scene may already comprise (e.g. only) 3D modeled objects arranged according to the Manhattan type, for example each aligned with a single Manhattan frame. For constructing a respective 3D scene for the Atlanta type, the provided initial 3D scene may already comprise (e.g. only) 3D modeled objects arranged according to the Manhattan type, for example each aligned with a same (e.g. single) Manhattan frame, or alternatively (e.g. only) 3D modeled objects arranged according to the Atlanta type, for example each aligned with a respective one of several Manhattan frames which share a same axis.

For constructing a respective 3D scene for the neither Manhattan nor Atlanta type, the same initial 3D scene (with an existing arrangement of 3D modeled objects according to the Manhattan or Atlanta) may be used in examples. In all cases, the result must ensure that the 3D modeled objects in the constructed scene are not arranged according to the Manhattan or Atlanta type. It may for example be ensured that said 3D modeled objects share no axis common to all. Training patterns for the neither Manhattan nor Atlanta type may also be added to the dataset by generating 2D images representative of said type from 2D images representative of other types, for example by using distortion.

The above principles may thus be used to implement an automatic populating process that efficiently forms a diverse and non-redundant dataset. The populating process may comprise initializing an (e.g. empty) dataset. The populating process may then comprise different steps, which may or may not be interlaced. The populating process may comprise providing one or more initial 2D images, and based on each 2D image creating several training patterns representative covering different 3D arrangement types to be recognized. The creation of training patterns may comprise constructing 3D scenes for at least a part of the contemplated 3D arrangement types, and generating 2D images for all the contemplated 3D arrangement types. The construction of 3D scenes may be based on any provided database of 3D modeled objects.

Providing any initial 3D scene within the method may comprise providing an initial 2D image representing the initial 3D scene, and determining the initial 3D scene based on the initial 2D image. In other words, the method may reconstruct a 3D scene from a an initial 2D image (e.g. a natural photograph), such that the reconstructed 3D scenes may be relatively realistic.

Determining an initial 3D scene based on an initial 2D image may be performed according to any algorithm of 2D-to-3D reconstruction. The algorithm may for example comprise computing characteristic line segments of the initial 2D image. The algorithm may also comprise determining vanishing points based on the characteristic line segments. The algorithm may also comprise determining one or more Manhattan frames and a respective projection from 2D to 3D, based on respective vanishing points. And the algorithm may comprise constructing 3D modeled objects in at least one respective Manhattan frame based on respective characteristic line segments and on the respective projection. The computation of the characteristic line segments of the initial 2D image may be performed to any algorithm. Such algorithm may comprise computing edge pixels; and fitting edge pixels with maximal lines. Examples of these particularly efficient algorithms are provided later.

The dataset formed by the method may be used in any way and at any later time. The dataset may for example be used for learning a function, for example via any neural network training. Such function may itself be used for any application. One example application is to provide an input 2D image and to apply the learnt function to the input 2D image, thereby classifying the input 2D image.

Such classification may then in examples be used to determine one or more projections each from 2D to a respective 3D (e.g. Manhattan) frame, based on the input 2D image and on the classification of the input 2D image.

In particular, when the function is configured for classifying 2D images according to the Manhattan, Atlanta or neither Manhattan nor Atlanta types, the function can output to a user a number of Manhattan frames relevant to assign to the 2D image (respectively 1, a positive integer higher than 1, or 0). The determination of the one or more projections may then be performed in any way based on such number, for example by the user or automatically.

Such assignment of Manhattan frame(s) may have several applications. One of them is to reconstruct a 3D scene represented by the input 2D image. Additionally, a user may then edit the 3D scene by sketching directly on a representation of the input 2D image. The Manhattan frame(s) and the projection(s) allow translating the 2D sketch into intended 3D geometry.

Such applications are known from the prior art.

FIG. 1 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

Examples of the method are now discussed with reference to FIGS. 2-27, where the predetermined types comprise the Manhattan type, the Atlanta type and the neither Manhattan nor Atlanta type.

The method of the examples deals with artificial neural network designed to recognize the arrangement type of a 2D photography: Manhattan type, Atlanta type or other type. More specifically, the artificial neural network may be trained before it is used.

Roughly speaking, a neural network may be defined by two features: topology and weights. The topology is a system of connected computing units and its design may be of any type. Each computing unit outputs a weighted combination of its input numerical data and sends this result to neighboring computing units according to the directed connections. The data flow runs from initial units fed by initial data down to terminal units, which yields the output numerical result.

Numerical combinations may be performed by using numerical coefficients called weights. Initially, the weights' values are unknown and they may be adjusted according to the neural network purpose: recognize arrangement types of 2D images. This adjustment step is named the training. In order to train the neural network, a sample of training patterns is needed. A training pattern is a pair of coherent input and output data. Using this information, dedicated algorithms are able to compute weights values.

A bottleneck of the training process is an appropriate sample of training patterns. It may be numerous and precise so that the neural network is robust and accurate. In the context of perspective image recognition, the sample of training patterns may in the prior art be prepared by users looking at images and recognizing the type of perspective. This manual process yields a few thousands of training patterns.

The human recognition for preparing the training patterns delivers a few thousands of elements, which is a too small number. This process is long and tedious and provides a poor training data base. Tests have been performed under the following conditions. Two users gathered 37122 images from the World Wide Web and recognized their respective arrangement type. Among all the recognized types, 14491 were correct. Among these correct types, 11790 were Manhattan types, 995 were Atlanta types and 1706 are other types. This illustrates that human recognition is error prone and does not provide a uniform repartition. A neural network trained with this material cannot be efficient enough.

The method of the examples provides a process to prepare training patterns in order to train a neural network that is dedicated to recognize arrangement types of 2D photos. The method of the examples makes use of Manhattan type photos of real 3D scenes. The principle is to insert virtual 3D objects into these Manhattan type photos. Appropriately inserting the 3D object allows the production of another Manhattan type image, a new Atlanta type image or a new "other type" image. So, by automatically varying inserted objects, an arbitrary large set of 2D images and their arrangement types can be created.

Examples of Neural Network Definition A neural network may be formally defined by a six-tuple $N=(X,U,\alpha,\omega,w,f)$ where X is the set of neurons, U is the set of directed connections, mapping $\alpha: U \to X$ describes start neurons of connections, mapping $\omega: U \to X$ describes end neurons of connections, the weight mapping $w: U \to \mathbb{R}$ associates a numerical weight to each connection and $f: \mathbb{R} \to [-1,1]$ is named the activation function.

This means that the start neuron of connection $u \in U$ is $\alpha(u)$, its end neuron is $\omega(u)$ and its weight is $w(u)$. Furthermore, the set of input connections of neuron $x \in X$ is $\omega^{-1}(x)$ and the set of output connections of neuron $x \in X$ is $\alpha^{-1}(x)$. Similarly, an inward neuron y of neuron x is the start neuron of an input connection of x, that is $y \in \alpha(\omega^{-1}(x))$. The topology of the neural network is defined by neurons and connections $(X,U,\alpha,\omega)$.

By definition, the activation function captures the nonlinear threshold effect of information propagation within the network. As described in the textbook by Kriesel David, A brief introduction to Neural Networks, 2006, a typical activation function is $$f(t) = \frac{1}{1+e^{-t}}.$$

From the mathematical point of view, a neural network is a directed graph with weighted arcs that is associated with an activation function.

By definition, an input neuron x has no input connections, meaning that $\omega^{-1}(x)=\emptyset$ and an output neuron x has no output connection, meaning that $\alpha^{-1}(x)=\emptyset$.

Each neuron $x \in X$ behaves like a computing unit in the following meaning. An output numerical value $\varphi(x)$ can be computed by combining numerical values of its inward neurons according to the following formula.

$$p(x) = \sum_{u \in \omega^{-1}(x)} w(u)\varphi(\alpha(u))$$
$$\varphi(x) = f(p(x))$$

Figure 2:
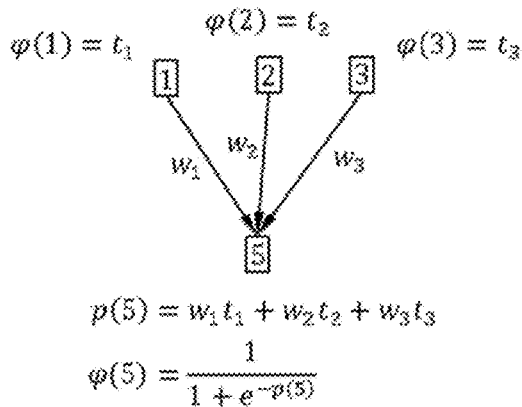

Value $p(x)$ is named the propagation value. It is the weighted sum of numerical values computed by start neurons $\alpha(u)$ of all connections u ending at neuron x. Value $\varphi(x)$ is the threshold effect $f(\cdot)$ applied to the propagation value $p(x)$. The formula is recursively defined and the ordering issue is addressed through the topology. FIG. 2 illustrates the computation at neuron 5 from its three inward neurons 1, 2 and 3.

A very popular topology of neural network is the feed forward model, as presented in the textbook by Kriesel David, A brief introduction to Neural Networks, 2006. The set of neurons is structured as ordered disjoint subsets named layers $X=I \cup H_1 \cup \ldots \cup H_h \cup O$ where I is named the input layer (the layer of input neurons), $H_i$, $i=1, \ldots, h$ are named hidden layers and O is named the output layer (the layer of output neurons). There are connections from each neuron of layer I to all neurons of layer $H_1$. There are connections from each neuron of layer $H_i$ to all neurons of layer $H_{i+1}$ for $i=1, \ldots, h-1$. There are connections from each neuron of the last hidden layer $H_h$ to all neurons of output layer O. In the context of a feed forward neural network, a specific activation function can be associated with each layer.

Figure 3:
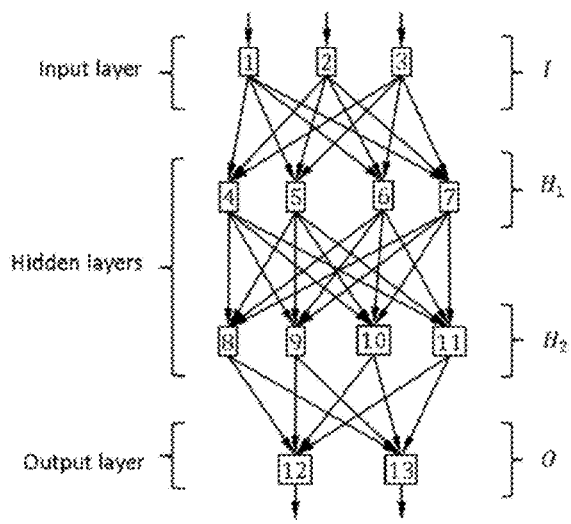

FIG. 3 illustrates a feed forward neural network featuring two hidden layers. Input neurons are symbolized with input arrow. Output neurons are symbolized with output arrows.

Clearly, the feed forward neural network is acyclic. So, setting numerical values $(t_x)_{x \in I}$ to input neurons, meaning that $\varphi(x):=t_x$ for all $x \in I$, and propagating the computation layer by layer yield numerical values $(z_y)_{y \in O}$ computed by output neurons. The mapping that computes $(z_y)_{y \in O}$ from $(t_x)_{x \in I}$ through the feed forward neural network is noted $F: \mathbb{R}^n \to \mathbb{R}^m$ where $n=|I|$ is the number of input neurons and $m=101$ is the number of output neurons.

Examples of Neural Network Training

Given the topology of a feed forward neural network, and given its activation function(s), the goal of the neural network training step may be to compute the weight mapping $w: U \to \mathbb{R}$. For this purpose, a set of training patterns is needed. A training pattern is a couple $((t_x)_{x \in I}, (z_y)_{y \in O}) \in \mathbb{R}^n \times \mathbb{R}^m$. This couple represents the output data $(z_y)_{y \in O}$ that the neural network is supposed to compute when fed with the input data $(t_x)_{x \in I}$. Input and output are computed by other means and they are used for teaching "if the input is $(t_x)_{x \in I}$, then the neural network must output $(z_y)_{y \in O}$".

Given a set of k training patterns $(t_x^i)_{x \in I}, (z_y^i)_{y \in O})$, $i=1, \ldots, k$ a dedicated algorithm is used to adjust the weight mapping in such a way that $F((t_x^i)_{x \in I})$ is as close as possible to $(z_y^i)_{y \in O}$ for $i=1, \ldots, k$. Typical algorithm for this purpose is the back propagation, as presented in the textbook by Kriesel David, *A brief introduction to Neural Networks*, 2006. From the mathematical point of view, this is an interpolation problem that computes the mapping F.

Figure 4:
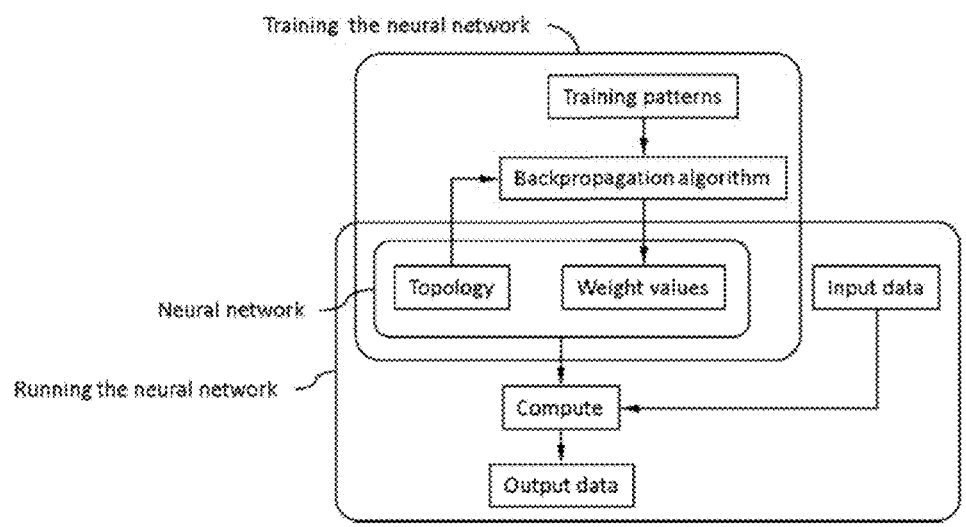

FIG. 4 illustrates examples of the training step vs. running step of the neural network.

Examples of Training a Classification Neural Network

Neural networks may particularly be used for classification. Given a finite set of $N_{Type}$ types of 3D data, the goal is for the neural network to recognize to which type an unknown input data belongs. A classification neural network may feature one output neuron per type. The numerical output value may be a vector $(\lambda_1, \ldots, \lambda_{N_{Type}})$ of $N_{Type}$ numbers in interval [0,1]. Each number $\lambda_i$ is the probability for the input data to be a type i data. A typical training pattern may be a known type i input data with an output vector such that $\lambda_j=0$ if $j \neq i$ and $\lambda_i=1$.

Examples of Image Definition, and Computing Edge Pixels

A 2D photo may be a 2D grid of points, the pixels, together with color information attached to each pixel. This may be captured by a grid of indexes $I=[1, \ldots, n] \times \{1, \ldots, m\}$, a position mapping $p: I \to \mathbb{R}^2$ associating 2D coordinates to indexes $p(i,j)=(x_i,y_j)$ and a color mapping $c: I \to RGB$ where RGB is the set of all colors, meaning that $c(i,j)$ is the color of pixel $(i,j)$ for all $(i,j) \in I$. The relevant graphical information for edge pixel computation may be the brightness. This may define a mapping b from the pixel table I to the set of non negative numbers $\mathbb{R}^+$, that is $b: I \to \mathbb{R}^+$. The brightness variation $v(i,j)$ at a pixel $(i,j) \in I$ may be defined by the magnitude of the (discrete) gradient of mapping b, that is $v(i,j)=\|\nabla b(i,j)\|$. Given a threshold value $\delta > 0$, a pixel $(i,j) \in I$ may be called an edge pixel if its brightness variation is larger than the threshold, that is $v((i,j)) \geq \delta$. Computing edge pixels on the photo of a 3D scene may be performed by any algorithm, such as the one described in the paper by Lu Wang, Suya You, Ulrich Neumann, Supporting range and segment-based hysteresis thresholding in edge detection, IEEE International Conference on Image Processing 2008.

Examples of Computing Characteristic Line Segments

Then, maximal line segments may be fitted to sets of approximately aligned edge points. A characteristic line segment may be such a line segment featuring a length that is larger than a predefined threshold.

Characteristic line segments computation may be performed by using a dedicated algorithm. The core of the algorithm may be to start with an edge pixel and to compute the largest set of approximately aligned neighboring edge pixels. The line segment approximating the set of approximately aligned pixels may be considered significant if it involves a large enough number of pixels and if the pixels are not too far from the line.

An example of a formal algorithm is now described. Note EP the (input) set of all edge pixels and note Lines the (output) set of characteristic line segments. Set K is the current set of pixels supposedly aligned. Set N is the current set of neighboring pixels.

```
While EP ≠ Ø do begin
    Let p ∈ EP
    EP:=EP − {p}
    K:={p}
    N:=Nb(p)
    While N ≠ Ø do begin
        Let n ∈ N
        N:=N − {n}
        line:= best fitting line through pixels
            of K ∪ {n}
        If MSDev(line,K ∪ {n}) < ε₁ and Dist(line,n) < ε₂
        then
            K:=K ∪ {n}
            N:=N ∪ (Nb(n) − N)
            CLine:=line
        End if
    End while
    If |K| > Np then
        Lines:=Lines ∪ {CLine}
        EP:=EP − K
    End if
End while
```

Figure 5:
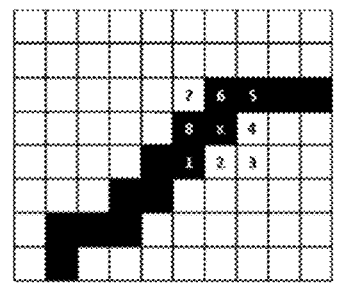

Function $Nb(x)$ outputs the neighboring edge pixels of input edge pixel x. The neighboring edge pixels are searched according to the 8-neighbors strategy, as illustrated in FIG. 5. Edge pixels are black squares. Neighboring pixels of pixel X are pixels number 1 to 8. Neighboring edge pixels of edge pixel X are pixels number 1, 5, 6 and 8.

Function $MSDev(l,S)$ outputs the mean square deviation of the best fitting line l to the set of pixels S. Function $Dist(l,x)$ outputs the distance from pixel x to line l. Function $|K|$ outputs the number of elements of set K.

Threshold $\varepsilon_1$ is the maximum mean square deviation, typical value is $\varepsilon_1=0.2$. Threshold $\varepsilon_2$ is the maximum distance from the pixel to the line, typical value is $\varepsilon_2=1.5$. Threshold Np is the minimum number of pixels that can give birth to a characteristic line segment, typical value is Np=15.

Conical Perspective: From 3D Scene to Image

Geometry of the Perspective

Figure 6:
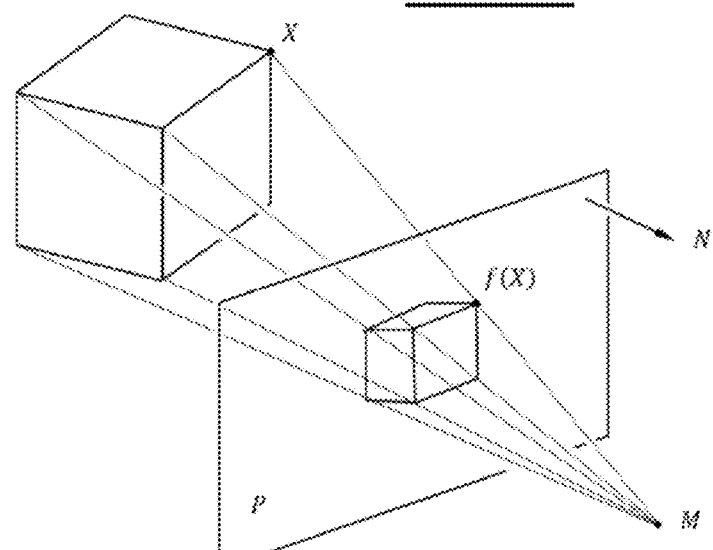
Figure 11:
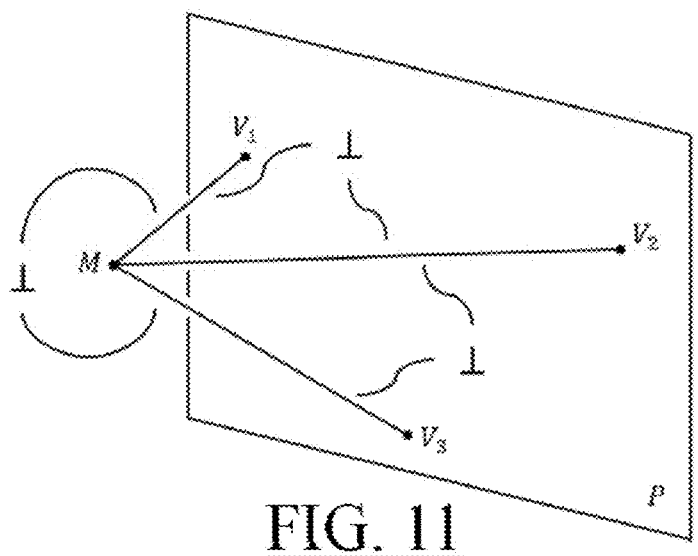
Figure 12:
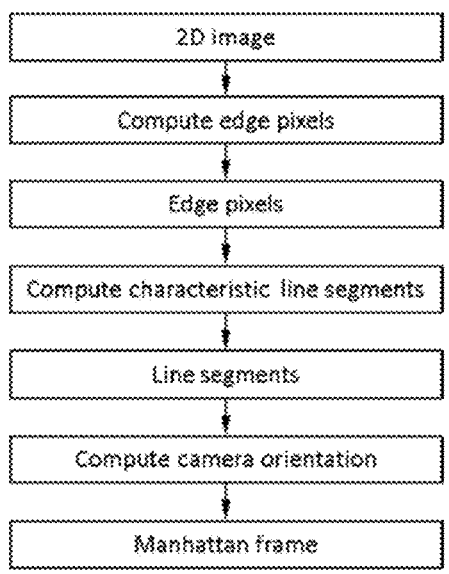

Consider a 3D scene S as a subset of the three dimensional space $\mathbb{R}^3$, consider a portion of a plane P, named the image plane, and a point M, named the observer's or camera position. The image plane normal vector is noted N. The camera perceives the 3D scene S through the image plane P according to a conical perspective. This means that each point X of the 3D scene generates a corresponding point f(X) on the image plane, named the image point in the following. By definition, the image point f(X) is the intersection point between the image plane P and the line through X and M, as illustrated in FIG. 6.

The mathematical formula is as follows.

$$f(X) = M - \frac{\langle M, N \rangle}{\langle X - M, N \rangle}(X - M)$$

Hidden Vs. Visible Portions

Beyond this geometrical definition, hidden and visible portions of the 3D scene may be defined. The mathematical image of the 3D scene $S \subset \mathbb{R}^3$ is f(S) and it is included in plane P. For each point $Z \in f(S)$, consider the set of points in the 3D scene that share the same image point Z, which is noted:

$$f^{-1}(Z) = \{X \in S, f(X) = Z\}$$

Generally, $f^{-1}(Z)$ includes a plurality of points, but only one is visible from M, which may be formalized as follows. By definition, the visible point from point Z ∈ f(S), noted V(Z), is the point $X \in f^{-1}(Z)$ closest to Z, which is noted:

$$V(Z) = \underset{X \in f^{-1}(Z)}{\operatorname{argmin}} \|X - Z\|$$

In FIG. 7 $f^{-1}(Z) = \{X_1, X_2, X_3, X_4\}$ and the visible point from Z is point $X_2 \in S$ because $\|X_2 - Z\| < \|X_i - Z\|$ for i=1, 3, 4.

The visible portion $V_S$ of 3D scene S is the set of all visible points, that is:

$$V_S = (V(Z), Z \in f(S))$$

Finally, by definition, the conical perspective $I_S \subset P$ of the 3D scene $S \subset \mathbb{R}^3$ is the image of visible points $V_S$ through mapping f:

$$I_S = (f(X), X \in V_S)$$

FIG. 8 illustrates a 3D scene S made of two rectangular blocks. The visible portion $V_S$ includes the bold lines. Hidden portions are dotted lines.

Vanishing Points

Consider two lines of the 3D scene sharing the same direction U that is not parallel to the image plane. It can be proven that their respective conical perspectives are two lines intersecting at a point that depends only on U and not on the lines positions. This point is named the vanishing point and is computed as V=f(M+U).

It can be proven that if direction U is parallel to the image plane, its conical perspective is a line with direction U as well. Consequently, lines of the 3D scene that are parallel to the image plane do not give birth to any vanishing point.

FIG. 9 illustrates the three vanishing points $V_1$, $V_2$ and $V_3$ of the conical image of a rectangular bloc (bold lines).

FIG. 10 illustrates a two vanishing points perspective image. Vertical lines of the bloc are parallel to the image plane, so they do not generate a vanishing point.

From 2D Image to 3D Scene: The Manhattan Frame Hypothesis

Considering a 2D image as the input data, a question may now be to compute the camera position M with respect to the image plane. This is generally impossible unless enough information is known about the 3D objects of the 3D scene. In the context of the method of the examples, an appropriate 3D object may be an orthogonal grid, symbolized by a cube or by a set of aligned rectangles. This is the well-known Manhattan frame hypothesis, as suggested in the paper by J. M. Coughlan, A. L. Yuille, *Manhattan World: Compass Direction from a Single Image by Bayesian Inference*, Proceedings International Conference on Computer Vision ICCV'99. Corfu, Greece, 1999.

Background art formulates the Manhattan frame hypothesis in terms of a 2D perspective.

A 3D scene S may be considered a Manhattan 3D scene, for the purpose of the classification contemplated by the method of the examples, if represented by a 2D image with a plane P and a point M such that the conical perspective Is, as defined in a previous section, only includes perspective of 3D objects aligned according to an orthogonal grid. This means that the 3D scene may include unaligned objects of curves objects, but that they are hidden by aligned objects or outside the scope defined by P and M.

From 2D Image to 3D Scene: Computing the Manhattan Frame

The following explains the relationship between vanishing points and camera position. Since $$f(M + U) = M - \frac{\langle M, N \rangle}{\langle U, N \rangle} U$$

then $$V - M = -\frac{\langle M, N \rangle}{\langle U, N \rangle} U$$

meaning that the line from the camera M to the vanishing point V defined by direction U is parallel to direction U. Thanks to this property, and knowing that directions of the 3D cube are mutually perpendicular, the camera position M is solution of the nonlinear system:

$$\langle M - V_1, M - V_2 \rangle = 0$$

$$\langle M - V_1, M - V_2 \rangle = 0$$

$$\langle M - V_2, M - V_2 \rangle = 0$$

This provides a straightforward way to compute the camera position. Consequently, edges directions of the 3D cube are $$U_i = \frac{M - V_i}{\|M - V_i\|}$$

for i=1, 2, 3. This is illustrated on FIG. 11.

Figure 13:
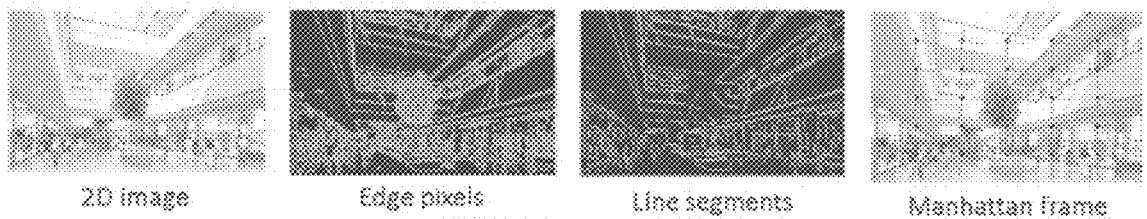

In fact, the method of the examples may make use of the paper by Patrick Denis, James H. Elder, Francisco J. Estrada, *Efficient Edge-Based Methods for Estimating Manhattan Frames in Urban Imagery*, European Conference on Computer Vision 2008, Part II, LNCS 5303, pp. 197-210, 2008, in order to compute the Manhattan frame. This algorithm is based on the previous geometrical principle, and it is robust due to statistical computations. The main steps are described in FIG. 12. FIG. 13 illustrates application of the algorithm.

Examples of Inserting Virtual Additional 3D Object in the 2D Image

Figure 14:
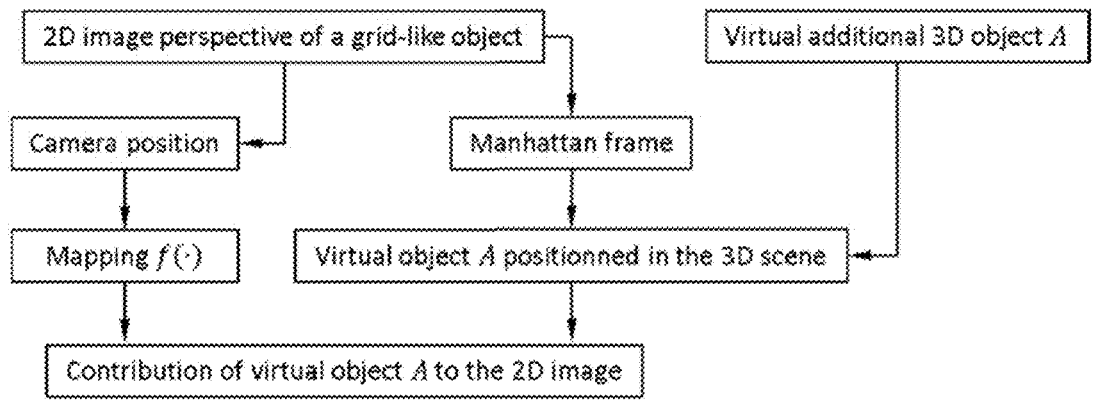

As earlier-explained, given the conical perspective of a grid-like object, normal vector N to image plane P and camera position M may be known so that mapping f can be set up easily. Furthermore, an axis system, named the Manhattan frame, made of vectors $U_1$, $U_2$ and $U_3$ as previously defined, can be attached to the 3D scene grid-like object. Thanks to this Manhattan frame, an additional virtual object can be virtually positioned in the 3D scene. The geometrical contribution of this virtual 3D object to the conical perspective may be computed by using mapping f. The overall dataflow is illustrated in the diagram of FIG. 14.

Manhattan Vs. Atlanta Perspective

A Manhattan type 3D scene features characteristic lines arranged according to a rectangular grid. Generally, one direction of the rectangular grid is parallel to the image plane, which is traditionally the vertical direction when dealing with architectural photos.

Figure 15:
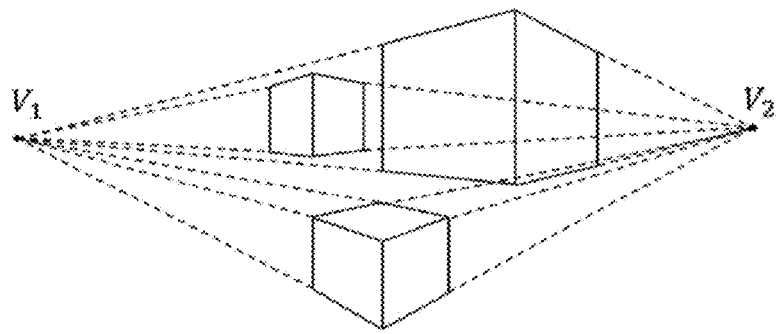

FIG. 15 illustrates a typical Manhattan image of a 3D scene made of three aligned blocks. Vanishing points are $V_1$ and $V_2$. Vertical lines of the 3D scene are parallel to the image plane, so their images are vertical lines as well.

Conversely, an Atlanta type 3D scene involves characteristic lines arranged according to at least two unaligned rectangular grids in such a way that all rectangular grids share one direction. The shared direction is generally the vertical direction.

Figure 16:
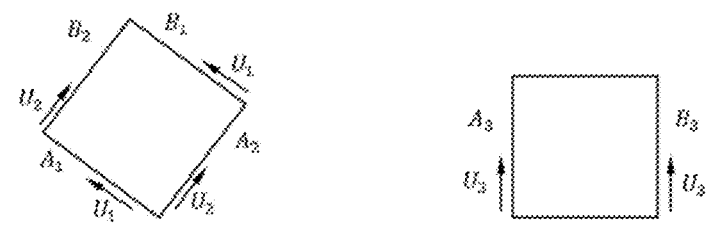
Figure 16:
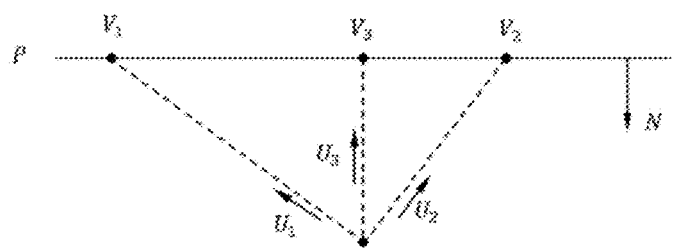

FIG. 16 illustrates two unaligned blocks together with image plane P and camera position M. The drawing plane of the figure is perpendicular to the image plane P. The vanishing point corresponding to parallel lines $A_1$ and $B_1$ is $V_1$. The vanishing point corresponding to parallel lines $A_2$ and $B_2$ is $V_2$. The vanishing point corresponding to parallel lines $A_3$ and $B_3$ is $V_3$. Each vanishing point $V_1$ is the intersection of the image plane P and the line from M in the direction $U_1$. Horizontal lines of the rightmost block are parallel to the image plane, so they do not generate any vanishing point.

Figure 17:
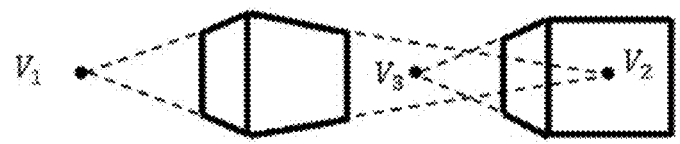

FIG. 17 illustrates the conical perspective view of the unaligned two blocks. This is an Atlanta type image because the two blocs are unaligned while sharing a direction (the vertical direction).

Other Type Arrangement (i.e. Neither Manhattan Nor Atlanta)

An image is said to be an "other type" perspective if it is neither a Manhattan type image nor an Atlanta type image. It is characterized either by at least two Manhattan grids sharing no direction at all, or by distorted perspective featuring no characteristic line at all.

Figure 18:

FIG. 18 illustrates the unaligned objects of an "other type" image.

Figure 19:

FIG. 19 illustrates distorted "other type" image.

Let $K=[x_{min},x_{max}]\times[y_{min},y_{max}]$ be the rectangle including all pixels positions of the image to be distorted. The distortion is obtained by composing the input image (typically a Manhattan image) with a distorsion mapping $d: \mathbb{R}^2 \rightarrow \mathbb{R}^2$. Mapping d is such that the distorted image contains the rectangle of the initial image, that is $$K \subset d(K)$$

Pixel (i,j) of the original image is at position $p(i,j) \in K$. It is moved at position $d(p(i,j)) \in d(K)$ by mapping $d(\cdot)$. So, the expected color at point $d(p(i,j))$ of the distorted image is the one $c(i,j)$ of the source pixel (i,j). Consider the color mapping $c^*: d(K) \rightarrow RGB$ that interpolate $c^*(d(p(i,j)))=c(i,j)$ for all $(i,j) \in I$ over $d(K)$. Then, the color mapping $c^{}$ of the distorted image over grid I is $c^{}: I \rightarrow RGB$ with $c^{**}(i,j)=c^*(p(i,j))$.

A typical mapping is a radial distortion:

$$d(x, y) = (1 + k(x^2 + y^2))\begin{pmatrix} x \\ y \end{pmatrix}$$

where k is chosen in the interval [0.001,0.004]. Coefficient k is randomly choosen in this interval for generating each distorted image. This mapping is applied to an image that is centered at (0,0).

Figure 20:
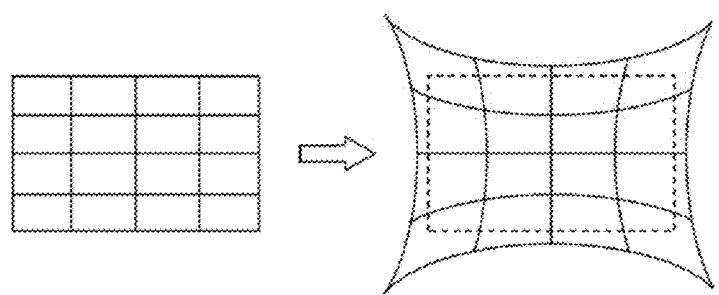

FIG. 20 illustrates the radial distortion effect on a rectangular grid. Straight lines are changed into curves, thus deleting the Manhattan structure.

Examples of Building Training Patterns

Figure 21:
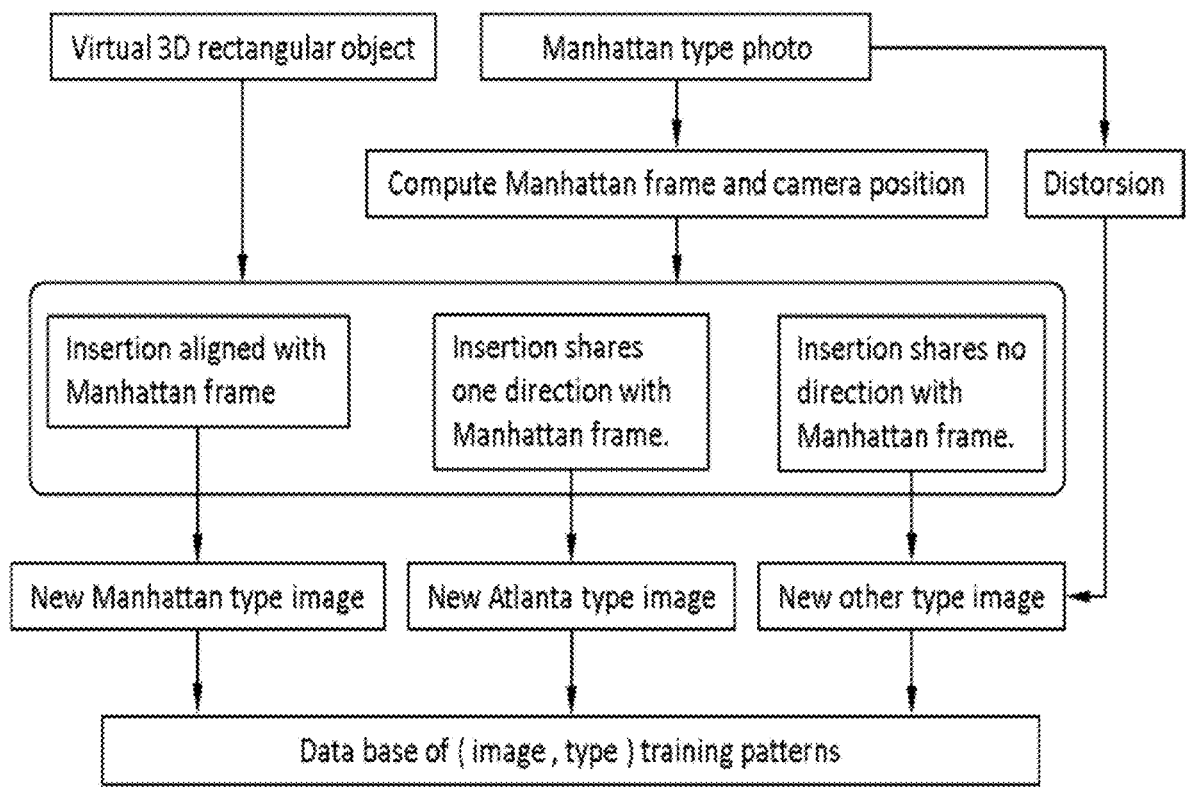

The training patterns generation process may in examples be as follows and as illustrated on FIG. 21. The input is a set of Manhattan type images. The output is a database of Manhattan type images, Atlanta type images and other type images associated with their respective type. Given a Manhattan type image, a new image is obtained by (virtually) inserting a (virtual) rectangular shape object in the 3D scene and by computing its contribution to the 2D photo. If the inserted object is aligned with the Manhattan frame, a new Manhattan image is obtained. If the inserted object shares only one direction with the Manhattan frame, a new Atlanta image is obtained. If the inserted object does not share any direction with the Manhattan frame, a new other type image is obtained. Another way to create other type image is to distort the input Manhattan image in such a way that no characteristic line can be recognized. In the data base, resulting images associated with their respective types (Manhattan, Atlanta or other type) provide input and output data useful for network training.

Figure 22:
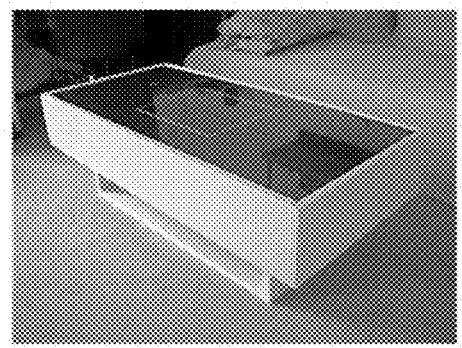
Figure 23:
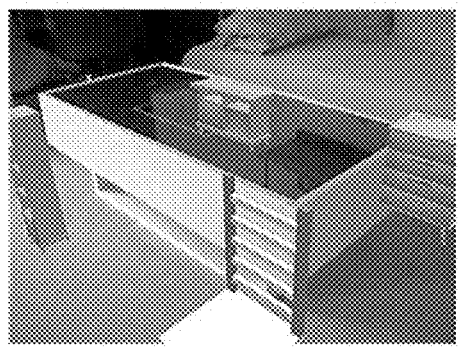

FIG. 22 illustrates a Manhattan image. FIG. 23 illustrates a new Manhattan image obtained by inserting virtual objects aligned with the Manhattan frame.

Figure 24:
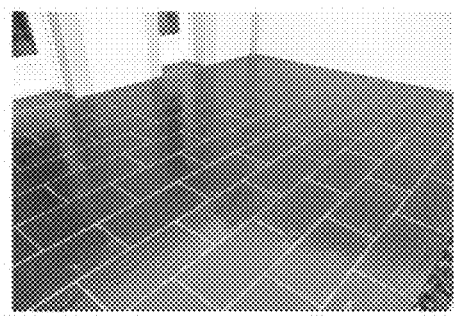
Figure 25:
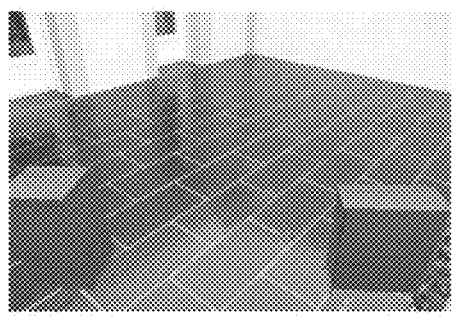

FIG. 24 illustrates a Manhattan image. FIG. 25 illustrates an Atlanta image obtained by inserting virtual objects that are not aligned with the Manhattan frame and share the vertical direction.

Figure 26:
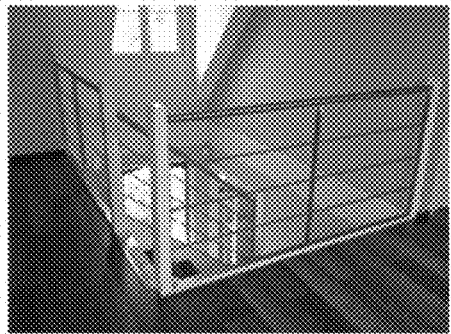
Figure 27:

FIGS. 26-27 illustrates an "other type" distorted image obtained from a Manhattan image.

The invention claimed is:

1. A computer-implemented method for forming a dataset configured for learning a function, the function being configured to classify 2D images according to predetermined types of 3D arrangement with respect to objects visible in the 2D images, the predetermined types of 3D arrangement including the Manhattan type and/or the Atlanta type, the method comprising, for each respective type of 3D arrangement:
   obtaining information indicative of the respective type of 3D arrangement;
   constructing 3D scenes each comprising 3D modeled objects arranged according to the respective type of 3D arrangement;
   generating 2D images each representing a respective 2D perspective of a respective constructed 3D scene where visible 3D modeled objects are among the 3D modeled objects of the respective constructed 3D scene which are arranged according to the respective type of 3D arrangement; and adding to the dataset training patterns each including a respective generated 2D image and the information indicative of the respective type of 3D arrangement, the dataset being applied in machine-learning of a function, the function configured to:

apply input 2D images, each input 2D image representing:
a respective 2D perspective of a respective 3D scene where visible 3D modeled objects are arranged according to the Manhattan type, or
a respective 2D perspective of a respective 3D scene where visible 3D modeled objects are arranged according to the Atlanta type, and output, for each input 2D image, information indicative of a respective type of 3D arrangement with respect to objects visible in the input 2D image, the function recognizing the Manhattan type and/or the Atlanta type in the input 2D image.

2. The method of claim 1, wherein for at least one respective type of 3D arrangement, all 3D modeled objects of one or more constructed 3D scenes are arranged according to the respective type of 3D arrangement.

3. The method of claim 1, wherein the constructing of each respective 3D scene for a respective type of 3D arrangement comprises:
obtaining an initial 3D scene and one or more reference frames; and
arranging 3D modeled objects in the initial 3D scene relative to the one or more reference frames based on the respective type of 3D arrangement.

4. The method of claim 3, wherein the predetermined types of 3D arrangement comprise the Manhattan type, and
wherein, for constructing a respective 3D scene for the Manhattan type, the obtained one or more reference frames consist of a single Manhattan frame and/or the provided initial 3D scene comprises 3D modeled objects each aligned with the single Manhattan frame.

5. The method of claim 1, wherein the predetermined types of 3D arrangement comprise the Atlanta type, and
wherein, for constructing a respective 3D scene for the Atlanta type, the obtained one or more reference frames consist of one or more Manhattan frames sharing an axis and/or the provided initial 3D scene comprises 3D modeled objects each aligned with a respective Manhattan frame.

6. The method of claim 1, wherein the predetermined types of 3D arrangement comprise the Atlanta type, and
wherein, for constructing a respective 3D scene for the Atlanta type, the obtained one or more reference frames consist of one or more Manhattan frames sharing an axis and/or the provided initial 3D scene comprises 3D modeled objects each aligned with a respective Manhattan frame which is a same Manhattan frame.

7. The method of claim 4, wherein the method further comprises:
for constructing a respective 3D scene for the Manhattan type, adding 3D modeled objects to the initial 3D scene each aligned with the single Manhattan frame.

8. The method of claim 4, wherein the method comprises:
for constructing a respective 3D scene for the Atlanta type, adding 3D modeled objects to the initial 3D scene each aligned with a respective Manhattan frame.

9. The method of claim 3, wherein obtaining an initial 3D scene further comprises:
obtaining an initial 2D image representing the initial 3D scene; and
determining the initial 3D scene based on the initial 2D image.

10. The method of claim 9, wherein the determining of the initial 3D scene based on the initial 2D image further comprises:
computing characteristic line segments of the initial 2D image;
determining vanishing points based on the characteristic line segments;
determining one or more Manhattan frames and a respective projection from 2D to 3D, based on respective vanishing points; and
constructing 3D modeled objects in at least one respective Manhattan frame based on respective characteristic line segments and on the respective projection.

11. The method of claim 10, wherein the computing of the characteristic line segments of the initial 2D image further comprises:
computing edge pixels; and
fitting edge pixels with maximal lines.

12. The method of claim 1, further comprising:
learning a function based on the dataset.

13. The method of claim 12, further comprising:
obtaining an input 2D image and applying the learnt function to the input 2D image, thereby classifying the input 2D image.

14. The method of claim 12, further comprising:
determining one or more projections each from 2D to a respective 3D Manhattan frame, based on the input 2D image and on the classification of the input 2D image.

15. The method of claim 14, further comprising: outputting a 3D scene represented by the input 2D image based on the one or more projections.

16. The method of claim 15, further comprising editing the 3D scene by user-sketching on a representation of the input 2D image.

17. A non-transitory computer readable medium having stored thereon a computer program including instructions that when executed by processing circuitry causes the processing circuitry to implement the method according to claim 1.

18. A computer system comprising:
a processor coupled to a memory, the memory having stored thereon instructions for performing a computer-implemented process for forming a dataset configured for learning a function, the function being configured to classify 2D images according to predetermined types of 3D arrangement with respect to objects visible in the 2D images, the predetermined types of 3D arrangement including the Manhattan type and/or the Atlanta type, the process being implemented by the processor and causing the processor to be configured to, for each respective type of 3D arrangement:

obtain information indicative of the respective type of 3D arrangement;

construct 3D scenes each comprising 3D modeled objects arranged according to the respective type of 3D arrangement, generate 2D images each representing a respective 2D perspective of a respective constructed 3D scene where visible 3D modeled objects are among the 3D modeled objects of the respective constructed 3D scene which are arranged according to the respective type of 3D arrangement, and add to the dataset training patterns each including a respective generated 2D image and the information indicative of the respective type of 3D arrangement, the dataset being applied in machine-learning of a function, the function configured to:

apply input 2D images, each input 2D image representing:
- a respective 2D perspective of a respective 3D scene where visible 3D modeled objects are arranged according to the Manhattan type, or
- a respective 2D perspective of a respective 3D scene where visible 3D modeled objects are arranged according to the Atlanta type, and output, for each input 2D image, information indicative of a respective type of 3D arrangement with respect to objects visible in the input 2D image, the function recognizing the Manhattan type and/or the Atlanta type in the input 2D image.

19. A computer system comprising:

a processor coupled to a memory, the memory having stored thereon a dataset formable by implementing a computer-implemented process for forming a dataset configured for learning a function, the function being configured to classify 2D images according to predetermined types of 3D arrangement with respect to objects visible in the 2D images, the predetermined types of 3D arrangement including the Manhattan type and/or the Atlanta type, the process being implemented by the processor and causing the processor to be configured to, for each respective type of 3D arrangement:

obtain information indicative of the respective type of 3D arrangement;

construct 3D scenes each comprising 3D modeled objects arranged according to the respective type of 3D arrangement, generate 2D images each representing a respective 2D perspective of a respective constructed 3D scene where visible 3D modeled objects are among the 3D modeled objects of the respective constructed 3D scene which are arranged according to the respective type of 3D arrangement, and add to the dataset training patterns each including a respective generated 2D image and the information indicative of the respective type of 3D arrangement, the dataset being applied in machine-learning of a function, the function configured to:

apply input 2D images, each input 2D image representing:
- a respective 2D perspective of a respective 3D scene where visible 3D modeled objects are arranged according to the Manhattan type, or
- a respective 2D perspective of a respective 3D scene where visible 3D modeled objects are arranged according to the Atlanta type, and output, for each input 2D image, information indicative of a respective type of 3D arrangement with respect to objects visible in the input 2D image, the function recognizing the Manhattan type and/or the Atlanta type in the input 2D image.

20. The system of claim 19, wherein for at least one respective type of 3D arrangement, all 3D modeled objects of one or more constructed 3D scenes are arranged according to the respective type of 3D arrangement.

* * * * *